(12) United States Patent
Chen et al.

(10) Patent No.: US 12,345,778 B2
(45) Date of Patent: Jul. 1, 2025

(54) HIGH-BANDWIDTH COAXIAL INTERFACE TEST FIXTURE

(71) Applicant: NVIDIA CORPORATION, Santa Clara, CA (US)

(72) Inventors: Yongwei Chen, Shenzhen (CN); Baal Yang, Shenzhen (CN); Tibet Zhao, Shenzhen (CN)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 17/997,116

(22) PCT Filed: Jul. 22, 2022

(86) PCT No.: PCT/CN2022/107223
§ 371 (c)(1),
(2) Date: Oct. 25, 2022

(87) PCT Pub. No.: WO2024/016294
PCT Pub. Date: Jan. 25, 2024

(65) Prior Publication Data
US 2024/0241191 A1    Jul. 18, 2024

(51) Int. Cl.
*G01R 31/58* (2020.01)
*G01R 1/067* (2006.01)
(Continued)

(52) U.S. Cl.
CPC ......... *G01R 31/58* (2020.01); *G01R 1/06744* (2013.01); *G01R 27/04* (2013.01); *H01R 24/40* (2013.01)

(58) Field of Classification Search
CPC ..... G01R 31/58; G01R 1/06744; H01R 24/40
See application file for complete search history.

(56) References Cited

U.S. PATENT DOCUMENTS

| 5,944,548 A | 8/1999 | Saito |
| 2003/0162430 A1* | 8/2003 | Shinzou ................ G01R 31/69 439/310 |

(Continued)

FOREIGN PATENT DOCUMENTS

| CA | 2174784 C | 7/1999 |
| CN | 1167921 A | 12/1997 |

(Continued)

OTHER PUBLICATIONS

Translation of CN 204359822 U to Chen et al. (Year: 2015).*
International Search Report for Application No. PCT/CN2022/107223 dated Dec. 22, 2022.

*Primary Examiner* — Paresh Patel
(74) *Attorney, Agent, or Firm* — Artegis Law Group, LLP

(57) ABSTRACT

A system for testing multiple devices includes a connector holder having a plurality of holes, wherein each hole included in the plurality of holes is configured to hold a respective cable connector that connects to a cable; a device holder that is configured to hold a first device in a testing position; and an engagement mechanism that supports the connector holder and is operable to move the connector holder to an engaged position, wherein when the first device is being held by the device holder in the testing position, and a first hole included in the plurality of holes holds a first cable connector, a contact point associated with the first cable connector contacts a signal pad associated with the first device.

18 Claims, 11 Drawing Sheets

(51) Int. Cl.
*G01R 27/04* (2006.01)
*H01R 24/40* (2011.01)

(56) References Cited

U.S. PATENT DOCUMENTS

2007/0167083 A1* 7/2007 Mineo .................. G01R 1/0416
439/638
2008/0076297 A1* 3/2008 Matsumura ........ G01R 31/2889
439/578

FOREIGN PATENT DOCUMENTS

| | | |
|---|---|---|
| CN | 204359822 U | 5/2015 |
| CN | 211014488 U | 7/2020 |
| CN | 111796177 A | 10/2020 |
| CN | 215575416 U | 1/2022 |
| CN | 216595394 U | 5/2022 |

\* cited by examiner

HIGH-BANDWIDTH COAXIAL INTERFACE TEST FIXTURE

BACKGROUND

Field of the Various Embodiments

Embodiments of the present disclosure relate generally to electronic device testing and test fixtures for electronic devices and, more specifically, to a high-bandwidth coaxial interface test fixture.

Description of the Related Art

As integrated circuits and computer devices are developed with increasing clock rates, designers of computing systems are required to take the increased clock rates and different interface protocols into account when developing new computing systems. The increased clock rates implemented in newer devices require insertion loss data to be measured at much higher frequencies using a greater number of Nyquist frequency points. For example, the Nyquist frequency of a newer device can be as high as 26.56 GHz. When designing a system incorporating such a device, a board-level system designer needs accurate loss performance of printed circuit board (PCB) and/or substrate materials within a bandwidth of no less than 30 GHz in order to accurately predict the insertion loss of the device in the board and to accurately predict the performance of the board incorporating the device. Accurate loss performance of the PCB and/or substrate materials is typically determined by measuring the loss performance of several (e.g., three to five) sample PCBs over at least two different lengths (e.g., four inches and eight inches) per sample PCB. That is, each sample PCB has at least two sets of traces, with each set having a different length, and losses of all of the sets of traces are measured to characterize the PCB material. The board-level system designer uses the measured loss performance of the PCB material when designing a PCB incorporating the device.

Once a PCB incorporating a device has been designed, a manufacturer typically chooses to manufacture a large number (e.g., 10,000) of the PCBs. However, for PCBs and substrates, various factors, such as different manufacturers' processes and different materials, can cause similar PCBs and substrates to have different loss performances. Therefore, to ensure that the performance of the manufactured PCBs matches the design specifications of the PCB, a system manufacturer typically tests a certain number of samples selected from the PCBs or substrates and compares the measured test data with the specifications for the PCBs or substrates received from the supplier. In some cases, a PCB supplier manufactures and supplies, with a batch of PCBs, one or more coupons manufactured from the same materials and under the same conditions as the batch and having traces of particular length for testing. In such cases, the system manufacturer tests the coupons and compares the measured test data with the specifications for the PCBs. In some cases, a system manufacturer tests all of the PCBs or substrates to ensure that the loss performance of each PCB or substrate matches the design specifications.

One approach for testing loss performance of a PCB or substrate requires a test engineer to contact a signal pad of the PCB or substrate, referred to as a device under test (DUT), with a handheld elastic microprobe. The handheld elastic microprobe is connected via a cable to a network analyzer. Contacting the signal pad with the microprobe places the DUT into electric communication with the network analyzer, enabling the network analyzer to measure the performance of the DUT. One drawback of this testing approach is that using handheld microprobes for testing can result in an impedance discontinuity caused by the abrupt change in inductance and resistance in the current path from the network analyzer through the cable and microprobe into the DUT. The abrupt changes in inductance and resistance result from the cross-section of the point of contact of the microprobe on the signal pad being different from the cross-section of the microprobe and from the cross-section of the signal pad on the DUT. As a general matter, impedance discontinuities can cause instabilities in high-frequency signals, such as the signals being measured when testing a DUT, which can result in poor or inaccurate test results. Also, because the microprobe is handheld, different test engineers can cause the microprobe to contact the signal pad with different amounts of force, resulting in impedance discontinuities that vary from test engineer to test engineer, which can negatively impact the repeatability of the test results. In addition, alignment of a handheld microprobe to a DUT is typically controlled by ensuring that four guide pins, which are connected with the microprobe, are inserted into four corresponding guide holes on the DUT that guide the microprobe to a correct position on the DUT. This type of connection structure is inherently imprecise because the guide holes have to be larger than the guide pins to allow the guide pins to be inserted into the guide holes, thereby enabling misalignments between the guide pins and the guide holes to arise. These misalignments can cause variabilities in the alignment between the microprobe and the DUT, which can also negatively impact the repeatability of the test results, especially if different test engineers are testing a set of DUTs from a particular batch.

Another approach for testing loss performance of a PCB or substrate uses a cable connector (e.g., a coaxial connector) to make contact with the signal pad of a DUT. The cable connector is connected via a cable to a network analyzer. Contacting the signal pad with the cable connector places the DUT into electric communication with the network analyzer, thereby enabling the network analyzer to measure the performance of the DUT. In one example of this approach, a solder free cable connector can be attached to a DUT with screws such that the contact point on the cable connector contacts a signal pad of the DUT. FIG. 1 illustrates such a configuration, where screws 102 are used to connect the cable connector 104 to the DUT 100. Importantly, mounting the cable connector to the DUT using screws causes the contact point of the cable connector to be positioned more precisely on the signal pad of the DUT relative to what can be achieved with a handheld microprobe that is aligned using guide pins and guide holes, as discussed above, because a screw fits into a corresponding threaded hole more precisely than a guide pin fits into a corresponding guide hole. One drawback of this testing approach, though, is that installing and removing the screws results in the time needed to test a DUT to increase relative to using a handheld microprobe for testing, as discussed above. The additional test time required causes this approach to be unsuitable for testing a large number of samples.

As the foregoing illustrates, what is needed in the art are more effective techniques for testing printed circuit boards and substrates.

SUMMARY

Various embodiments of the present disclosure set forth system for testing multiple devices. The system includes a connector holder having a plurality of holes, wherein each hole included in the plurality of holes is configured to hold a respective cable connector that connects to a cable; a device holder that is configured to hold a first device in a testing position; and an engagement mechanism that supports the connector holder and is operable to move the connector holder to an engaged position, wherein when the first device is being held by the device holder in the testing position, and a first hole included in the plurality of holes holds a first cable connector, a contact point associated with the first cable connector contacts a signal pad associated with the device.

At least one technical advantage of the disclosed design relative to the prior art is that, with the disclosed design, devices can be tested far more rapidly than what is possible with prior art designs and techniques. Another technical advantage is that the disclosed design enables more robust and consistent testing device-to-device than what is possible using prior art designs and techniques. Another technical advantage is that the disclosed design reduces wear on the cable connectors as compared to the prior art designs and techniques, lowering the expense of testing. These technical advantages provide one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

Figure 1:
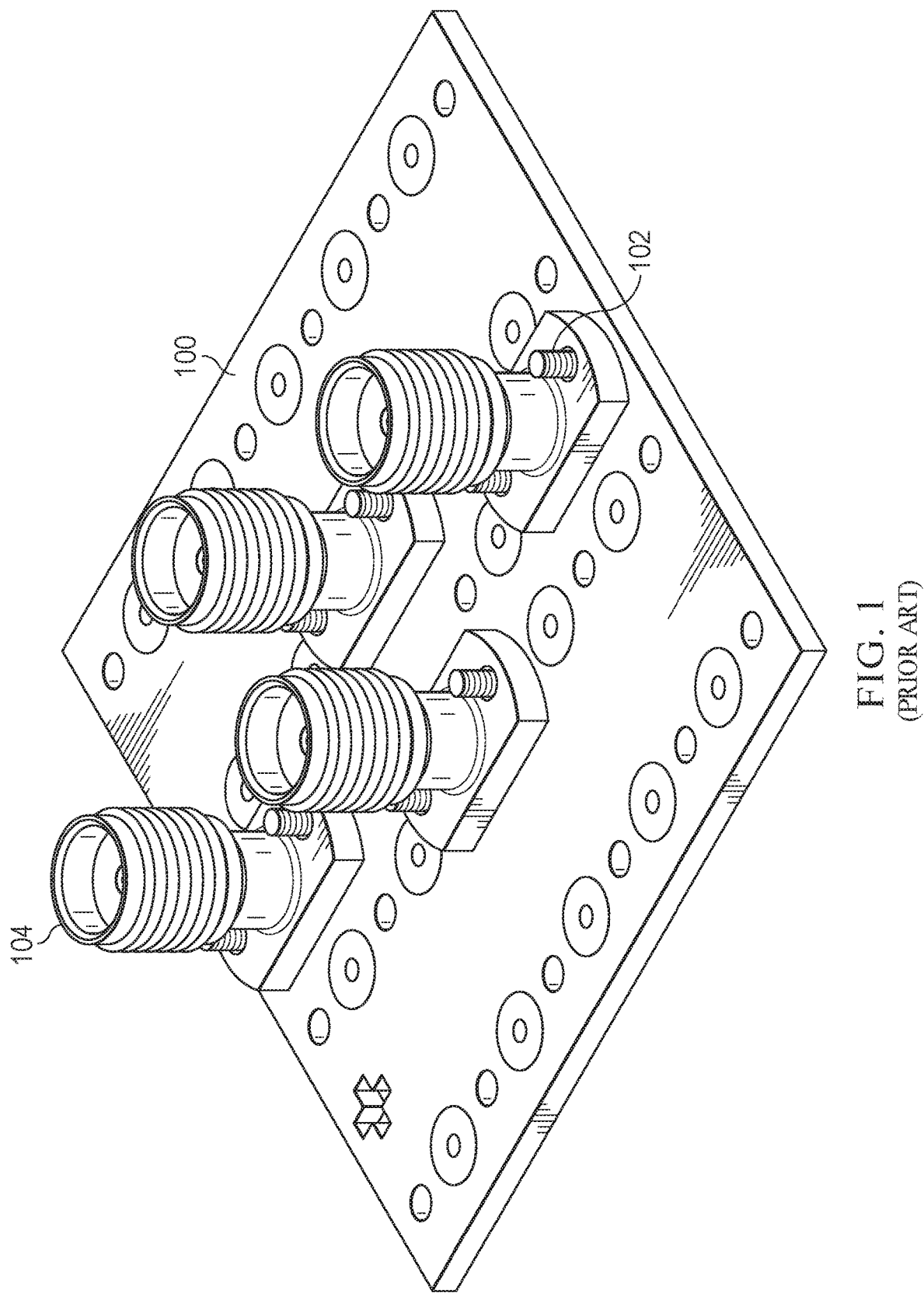
FIG. 1 is a diagram of a device under test (DUT) with cable connectors mounted with screws, according to the prior art.
Figure 2:
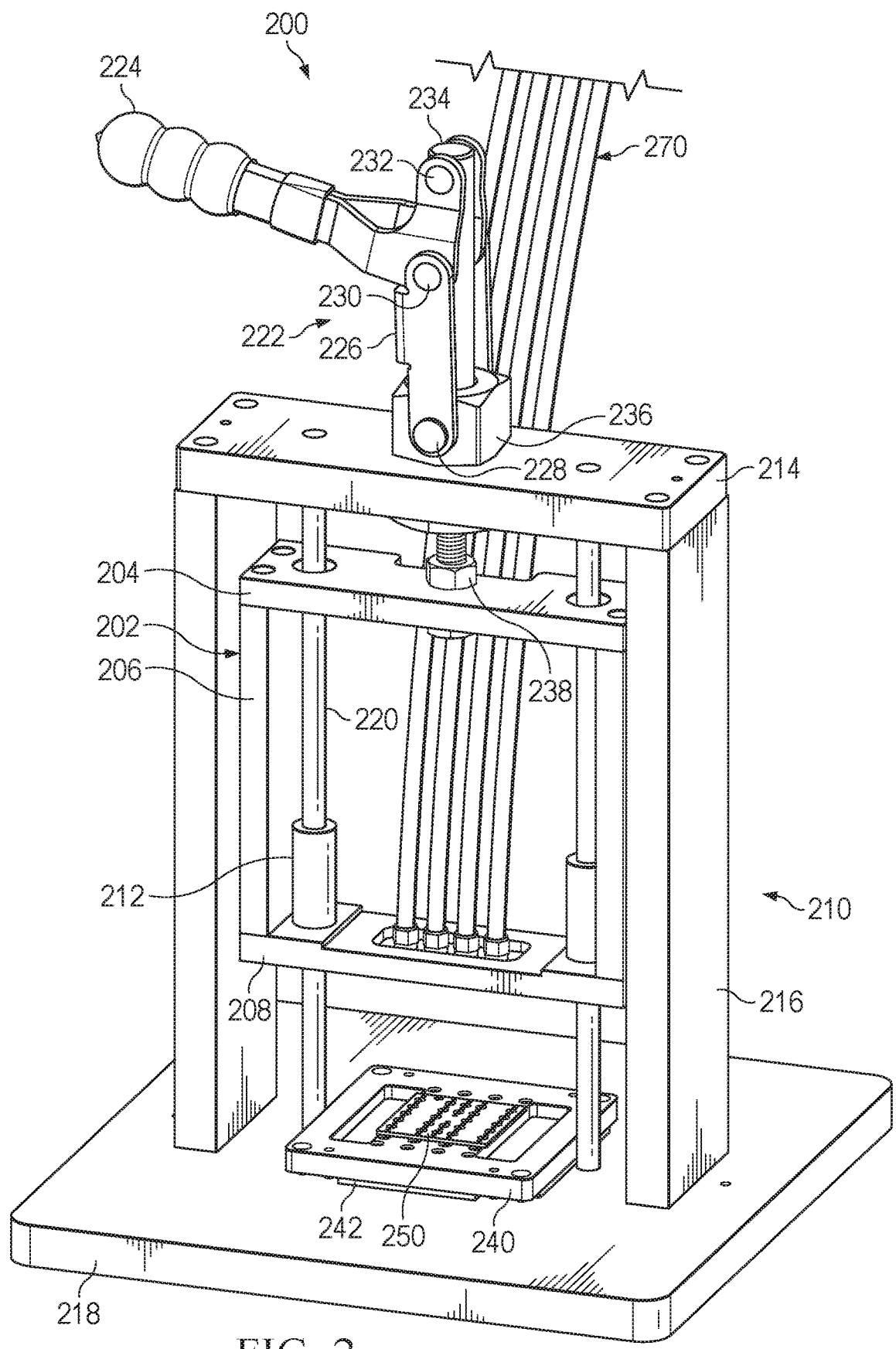
FIG. 2 is an isometric view of a fixture in a ready position, according to various embodiments.

FIG. 2 is an isometric view of a fixture 200 in a ready position, according to various embodiments. As shown, the fixture 200 includes, without limitation, a connector holder frame 202, a connector holder 208, a support frame 210, an engagement mechanism 222, and a device holder 240. The illustrated position is referred to as the "ready position" because the connector holder 208 is separated from the device holder 240, making the device holder 240 accessible, which allows a test engineer to remove a device under test (DUT) 250 from the device holder 240 and install a new DUT 250 on the device holder 240. When the connector holder 208 and/or engagement mechanism 222 are referred to as being in the ready position, the connector holder 208 and/or engagement mechanism 222 are in the positions that the connector holder 208 and/or engagement mechanism 222 occupy when the fixture 200 is in the ready position.

The connector holder frame 202 rigidly connects the connector holder 208 with the engagement mechanism 222. The connector holder frame 202 can be assembled from a connector holder frame crosspiece 204 connected with two or more connector holder frame vertical members 206, as shown, or can be a single monolithic piece (not shown). The connector holder frame 202 transfers motion from the engagement mechanism 222 to the connector holder 208 such that the connector holder 208 moves from the ready position to the engaged position in response to the engagement mechanism 222 being activated.

The connector holder frame crosspiece 204 can be formed from any rigid material, such as aluminum, steel, or plastic. The connector holder frame crosspiece 204 is rigidly connected with the connector holder frame vertical members 206. The connector holder frame crosspiece 204 can be bolted to the connector holder frame vertical members 206, as shown, or can be connected with the connector holder frame vertical members 206 by any technically feasible rigid means. The connector holder frame crosspiece 204 is also rigidly connected with the engagement mechanism 222. The connector holder frame crosspiece 204 can, for example, be bolted to the push rod 234 with a force adjusting screw 238, as shown.

The connector holder frame vertical members 206 can be formed from any rigid material, such as aluminum, steel, or plastic. The connector holder frame vertical members are rigidly connected with the connector holder frame crosspiece 204. The connector holder frame vertical members 206 can be bolted to the connector holder frame crosspiece 204, as shown, or can be connected with the connector holder frame crosspiece 204 by any technically feasible rigid means. The connector holder frame vertical members 206 are rigidly, removably connected with the connector holder 208. That is, the connector holder frame vertical members 206 are rigidly connected to the connector holder 208, but the connector holder frame vertical members 206 can be disconnected from the connector holder 208 (e.g., by removing bolts), and another connector holder (e.g., connector holder 508, shown in FIG. 5) can be connected to the connector holder frame vertical members 206.

The connector holder 208 can be formed from any rigid material. The connector holder 208 is rigidly, removably connected with the connector holder frame vertical members 206. The connector holder 208 is also rigidly, removably connected with guides 212. As shown in greater detail in conjunction with FIG. 9, the connector holder has a number of holes, where each hole is configured to hold a cable connector (e.g., a 2.92 mm coaxial connector). The connector holder 208 can also have cable connector cutouts, where each cable connector cutout is configured to hold at least one base of a cable connector. The connector holder 208 can further have one or more cable end cutouts, where the one or more cable end cutouts are configured to provide clearance between connector holder 208 and the cable connectors. The clearance enables a hand (e.g., a hand of a test engineer) or a hand-tool (e.g., a wrench) to access a cable end of a cable that is attached to a cable connector held in the connector holder 208.

The support frame 210 includes, without limitation, a support frame crosspiece 214, two or more support frame vertical members 216, a base 218, one or more guiderails 220, and a guide 212 for each of the guiderails. The support frame 210 supports the engagement mechanism 222 and rigidly connects the engagement mechanism 222 with the base 218.

The support frame crosspiece 214 can be made of any rigid material. The support frame crosspiece 214 is rigidly connected with the support frame vertical members 216. The support frame crosspiece 214 supports and is rigidly connected with the engagement mechanism 222. The support frame crosspiece 214 is also rigidly connected with the guiderails 220.

The support frame vertical members 216 are rigidly connected with the support frame crosspiece 214 and support the support frame crosspiece 214. The support frame vertical members 216 and support frame crosspiece 214 can be bolted together, as shown, or can be formed as a single monolithic piece.

The base 218 can be made of any rigid material. The base 218 supports the support frame vertical members 216 and is rigidly connected with the support frame vertical members 216. The base 218 also supports and is rigidly connected with the guiderails 220. The base 218 further supports and is rigidly, removably connected with the device holder 240.

The guiderails 220 run between the support frame crosspiece 214 and the base 218. The guiderails have a smooth surface and can be made of any rigid material. The guides 212 are configured to be rigidly, removably connected with the connector holder 208 and to slide smoothly along the guiderails 220. The guides 212 can, for example, incorporate bearings or bushings to enable the guides 212 to slide along the guiderails 220.

The engagement mechanism 222 is rigidly connected with the support frame crosspiece 214 and the connector holder frame crosspiece 204. The engagement mechanism 222 is operable to move the connector holder frame 202 and the connector holder 208 between the ready position and the engaged position. The engagement mechanism 222 includes, without limitation, a handle 224, a first link 226, a first pivot 228, a second pivot 230, a third pivot 232, a push rod 234, and a push rod guide 236. As shown in greater detail in conjunction with FIG. 4, the engagement mechanism 222 also includes a second link, a fourth pivot, a fifth pivot, and a sixth pivot. While the engagement mechanism 222 is described as a handle 224, first link 226, second link, first pivot 228, second pivot 230, third pivot 232, fourth pivot, fifth pivot, sixth pivot, and push rod 234, the engagement mechanism 222 can be any technically feasible type of mechanism (e.g., a scissor mechanism or a pneumatic ram) operable to cause the connector holder frame 202 and the connector holder 208 to move vertically.

The handle 224 can be made of any rigid material. The handle 224 has holes through which coaxial axes of rotation of the third pivot 232 and the sixth pivot pass, and the handle can be rotated about the axes of rotation of the third pivot 232 and the sixth pivot. The second pivot 230 and the fifth pivot are mounted to the handle 224.

The first link 226 can be made of any rigid material. The first link 226 has holes through which axes of rotation of the first pivot 228 and the second pivot 230 pass, and the first link 226 can rotate about the axis of rotation of the first pivot 228 and about the axis of rotation of the second pivot 230.

The first pivot 228 connects the push rod guide 236 with the first link 226. The first pivot 228 forms a hinge point, and the push rod guide 236 and the first link 226 can rotate with respect to each other about this hinge point. The second pivot 230 connects the handle 224 with the first link 226. The second pivot 228 also forms a hinge point, and the handle 224 and the first link 226 can rotate with respect to each other about this hinge point. The third pivot 232 connects the handle 224 with the push rod 234. The third pivot 232 also forms a hinge point, and the handle 224 and the push rod 234 can rotate with respect to each other about this hinge point.

The push rod 234 can be made of any rigid material and has a smooth surface. The push rod 234 is rigidly, adjustably connected with the connector holder frame crosspiece 204. The push rod 234 passes through and is guided by the push rod guide 236. The push rod guide 236 can be made of any rigid material and may incorporate a bushing or bearing enabling the push rod 234 to slide through the push rod guide 236. The push rod guide 236 is rigidly connected with the support frame crosspiece 214.

The force adjusting screw 238 enables adjustment of the connection between the push rod 234 and the connector holder frame crosspiece 204. The force adjusting screw 238 can be turned to move the connector holder frame crosspiece 204 closer or further from the end of the push rod 234. By adjusting the connection between the push rod 234 and the connector holder frame crosspiece 204, the vertical distance traveled by the connector holder 208 between the ready position and an engaged position (described below in conjunction with FIG. 3) can be adjusted.

The device holder 240 can be made of any rigid material. The device holder 240 can be horizontally aligned with the base 218 by means of bolts or screws. An optional cushion 242 beneath the device holder 240 can allow the device holder 240 to move vertically with respect to the base 218. The optional cushion 242 can be made of any flexible material, such as rubber.

Figure 3:
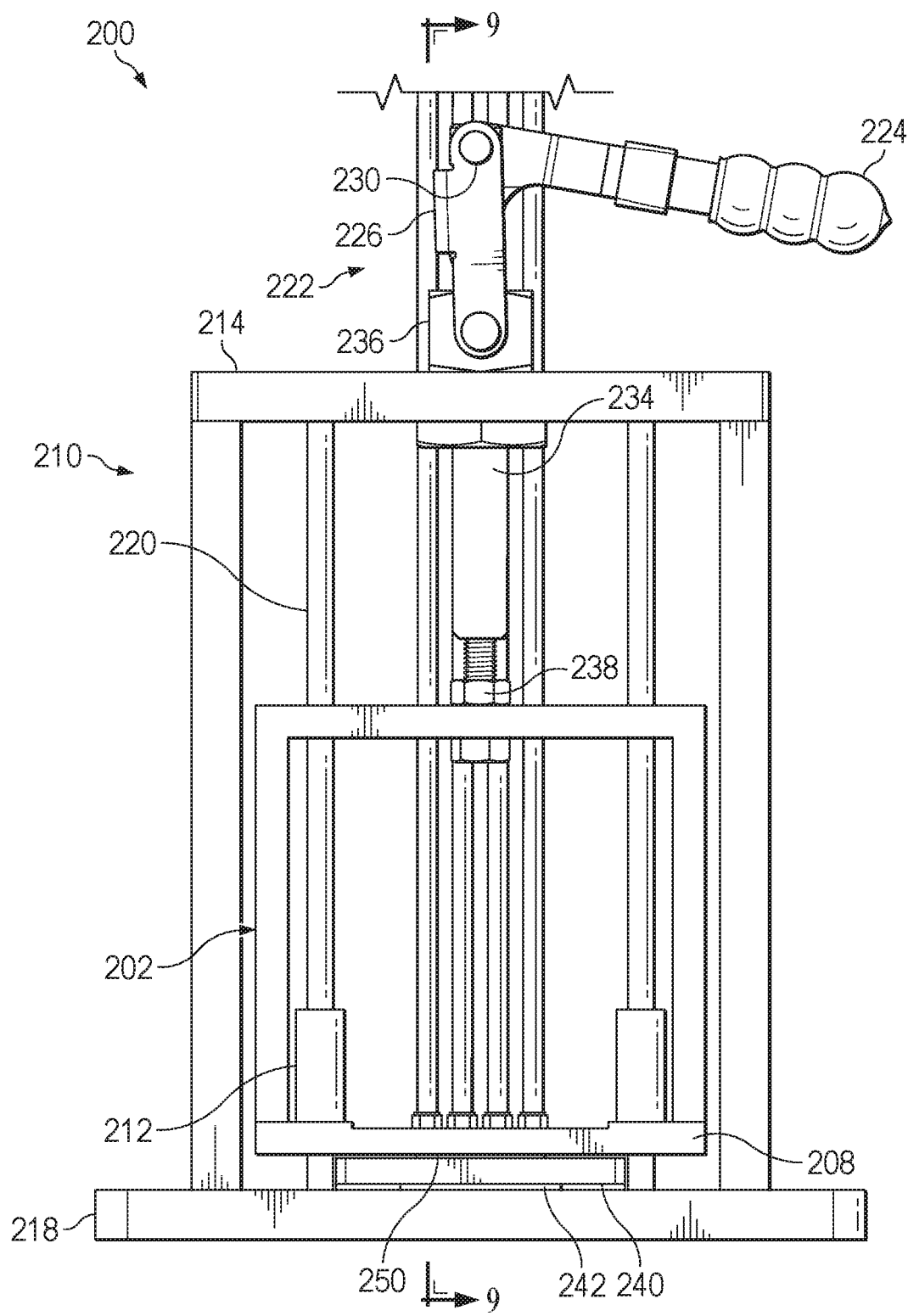
FIG. 3 is a front elevation view of the fixture of FIG. 2 in an engaged position, according to various embodiments.

FIG. 3 is a front elevation view of the fixture 200 of FIG. 2 in the engaged position, according to various embodiments. As shown, when the handle 224 moves from the left side of the fixture 200 (as shown in FIG. 2) to the right side of the fixture 200, the engagement mechanism 222 causes the push rod 234 to move down into the engaged position. The illustrated position is referred to as the "engaged position" because the connector holder 208 is proximate to the device holder 240 and cable connectors held in the connector holder 208 can contact a DUT 250 on the device holder 240. When the connector holder 208 and/or engagement mechanism 222 are referred to as being in the engaged position, the connector holder 208 and/or engagement mechanism 222 are in the positions that the connector holder 208 and/or engagement mechanism 222 occupy when the fixture 200 is in the engaged position.

The movement of the push rod 234 causes the force adjusting screw 238 to move down, which in turn causes the connector holder frame 202 and the attached connector holder 208 to move down. The cable connectors that are held by the connector holder 208 move down and touch the DUT 250 when the fixture 200 is in the engaged position.

The motion of the push rod 234 is constrained by the push rod guide 236 to be vertical, relative to the support frame 210. Similarly, the motion of the connector holder 208 is constrained to follow the guiderails 220 by the guides 212, which are rigidly connected to the connector holder 208. Because each of the guide rails 220 is rigidly connected to the support frame crosspiece 214 and the base 218 in a vertical orientation, the motion of the connector holder 208 is also vertical relative to the support frame crosspiece 214, the base 218, and the support frame 210 as a whole.

When a DUT 250 is tested in the fixture 200, the DUT 250 is positioned in a test position on the device holder 240. Cables 270 are connected between cable connectors held by the connector holder 208 and a network analyzer (not shown). Activating the engagement mechanism 222 (e.g., moving the handle 224) moves the connector holder 208 into the engaged position. The guides 212 guide the connector holder 208 along the guiderails 220 as the connector holder 208 moves from the ready position to the engaged position. When the connector holder 208 is in the engaged position, contact points associated with the cable connectors held by the connector holder 208 touch signal pads of the DUT 250. Test signals from the network analyzer can be conducted to the DUT 250 and back again by the cables 270 and cable connectors held by the connector holder 208, when the connector holder 208 is in the engaged position. When testing of the DUT 250 is complete, the engagement mechanism 222 can be deactivated to return the connector holder 208 to the ready position, shown in FIG. 2. With the connector holder 208 in the ready position, the DUT 250 can be removed and replaced with a new DUT 250. In this manner, multiple devices can be tested one-by-one in the fixture 200.

When the fixture 200 is in the engaged position, a downward force is applied by the handle 224 via the third pivot 232 to the push rod 234. The push rod 234 transfers the downward force into the force adjusting screw 238, which transfers the downward force into the connector holder frame 202. The connector holder frame 202 transfers the downward force into the connector holder 208. The connector holder 208 transfers at least some of the downward force into the cable connectors held by the connector holder 208. In some cases, the connector holder 208 also transfers some of the downward force into the DUT 250 and/or the device holder 240. The cable connectors held by the connector holder 208 transfer the downward force into the DUT 250, which transfers the downward force into the device holder 240. The device holder 240 transfers the downward force into the optional cushion 242 (if present) and/or into the base 218.

The downward force (described above) exerted by the handle 224 on the push rod 234 via the third pivot 232 is opposed by an upward force that the handle 224 exerts on the second pivot 230. The second pivot 230 transfers the upward force to the first link 226. The first link 226 transfers the upward force into the push rod guide 236. The push rod guide 236 transfers the upward force into the support frame 210. The support frame 210 transfers the upward force into the base 218.

The combination of the downward force transferred into the connector holder 208 and the upward force transferred into the base 218 results in the DUT 250, device holder 240, and optional cushion 242 being compressed between the connector holder 208 and the base 218. The downward and upward forces can be adjusted by rotating the force adjusting screw 238. Rotating the force adjusting screw 238 in one direction raises the connector holder frame 202 and connector holder 208 with respect to the push rod 234. Rotating the force adjusting screw 238 in the opposite direction lowers the connector holder frame 202 and connector holder 208 with respect to the push rod 234. Raising or lowering the connector holder 208 with respect to the push rod 234 results in the connector holder 208 also being raised or lowered with respect to the base 218. Because the engagement mechanism 222 moves the push rod 234, connector holder frame 202, and connector holder 208 a consistent distance on each engagement, adjusting the vertical position of the connector holder 208 with respect to the base 218 adjusts the strains that the connector holder 208, DUT 250, device holder 240, and base 218 experience when the fixture 200 is in the engaged position and hence the downward force exerted by the connector holder 208 on the DUT 250. In this manner, the downward and upward forces exerted by the fixture 200 can be adjusted to accommodate different DUTs 250 that can have differing thicknesses while still ensuring that the cable connectors held by the connector holder 208 contact each DUT 250 with a consistent force, enabling consistent testing of each DUT 250 in turn.

Figure 4:
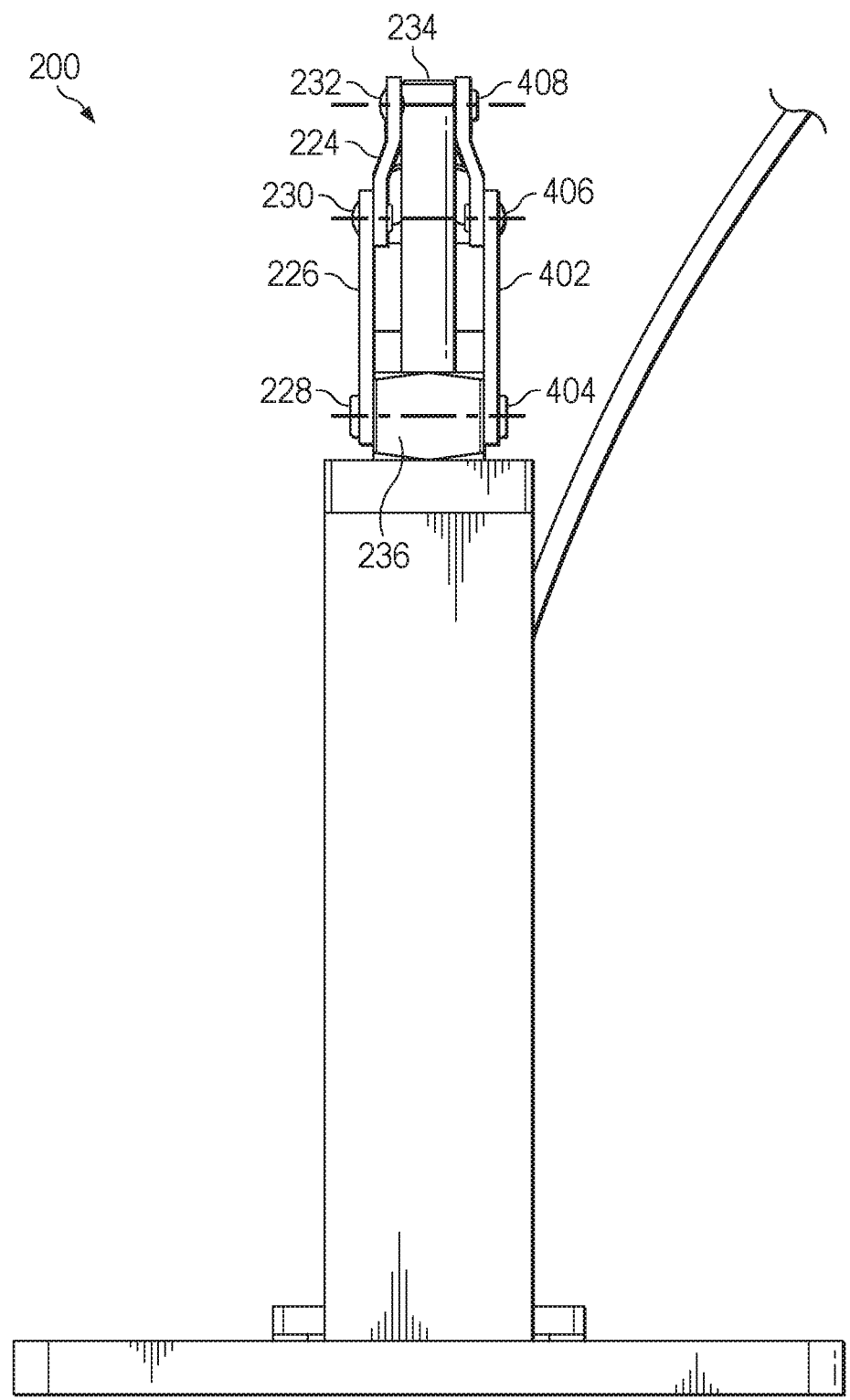
FIG. 4 is a side elevation view of the fixture of FIG. 2 in a ready position, according to various embodiments.

FIG. 4 is a side elevation view of the fixture 200 of FIG. 2 in the ready position, according to various embodiments. As shown, engagement mechanism 222 includes, without limitation, a second link 402, fourth pivot 404, fifth pivot 406, and sixth pivot 408. The first pivot 228 and fourth pivot 404 are coaxial, as illustrated. Similarly, the second pivot 230 and fifth pivot 406 are coaxial. The third pivot 232 and sixth pivot 408 are also coaxial.

The second link 402 can be made of any rigid material. The second link 402 has a first hole through which the axis of rotation of the fourth pivot 404 passes and a second hole through which the axis of rotation of the fifth pivot 406 passes. The fourth pivot 404 connects the push rod guide 236 with the second link 402. The fourth pivot 404 forms a hinge point that is aligned with the hinge point formed by the first pivot 228, and the push rod guide 236 and the second link 402 can rotate with respect to each other about this hinge point. The fifth pivot 406 connects the handle 224 with the second link 402. The fifth pivot 406 forms a hinge point that is aligned with the hinge point formed by the second pivot 230, and the handle 224 and the second link 402 can rotate with respect to each other about this hinge point. The sixth pivot 408 connects the handle 224 with the push rod 234. The sixth pivot 408 forms a hinge point that is aligned with the hinge point formed by the third pivot 232, and the handle 224 and the push rod 234 can rotate with respect to each other about this hinge point.

When the fixture 200 is in the engaged position, as shown in FIG. 3, a downward force is applied by the handle 224 via the sixth pivot 408 to the push rod 234. The push rod 234 transfers the downward force into the force adjusting screw 238, which transfers the downward force into the connector holder frame 202. The connector holder frame 202 transfers the downward force into the connector holder 208. The connector holder 208 transfers at least some of the downward force into the cable connectors held by the connector holder 208. In some cases, the connector holder 208 also transfers some of the downward force into the DUT 250 and/or the device holder 240. The cable connectors held by the connector holder 208 transfer the downward force into the DUT 250, which transfers the downward force into the device holder 240. The device holder 240 transfers the downward force into the optional cushion 242 (if present) and/or into the base 218.

The downward force (described above) exerted by the handle 224 on the push rod 234 via the sixth pivot 408 is opposed by an upward force that the handle 224 exerts on the fifth pivot 406. The fifth pivot 406 transfers the upward force to the second link 402. The second link 402 transfers the upward force into the push rod guide 236. The push rod guide 236 transfers the upward force into the support frame 210. The support frame 210 transfers the upward force into the base 218. The combination of downward force transferred into the connector holder 208 and the upward force transferred into the base 218 results in the DUT 250, device holder 240, and optional cushion 242 being compressed between the connector holder 208 and the base 218, as described herein.

Figure 5:
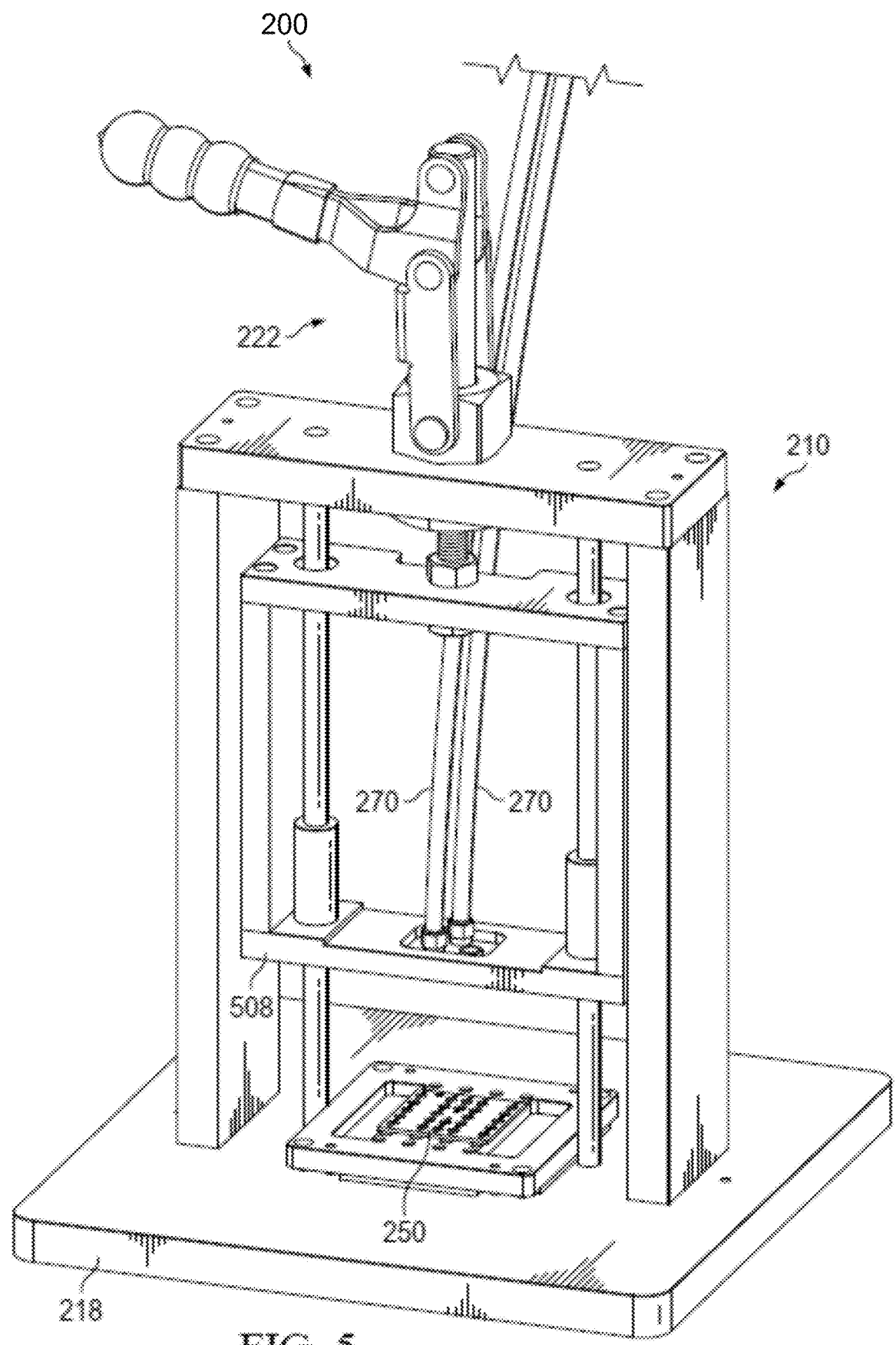
FIG. 5 is an isometric view of the fixture of FIG. 2 in a ready position with cables for a single-ended test, according to various embodiments.

FIG. 5 is an isometric view of the fixture of FIG. 2 in the ready position with two cables 270, according to various embodiments. As shown, a connector holder 508 that is different from the connector holder 208 can be used with the support frame 210, base 218, and engagement mechanism 222. The connector holder 508 has two holes configured to hold two cable connectors to which the two cables 270 are connected.

Figure 6:
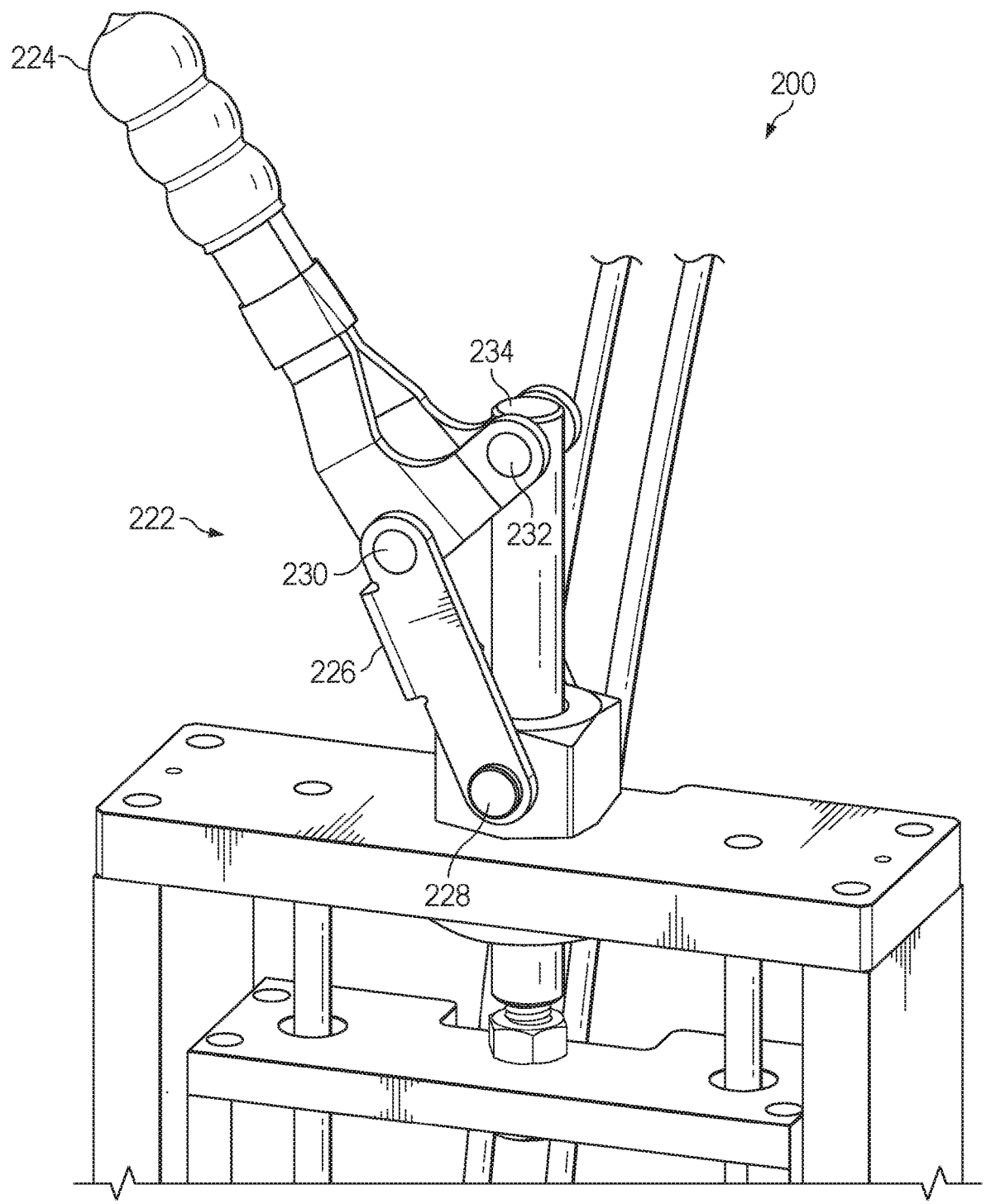
FIG. 6 is an isometric view of the engagement mechanism of the fixture of FIG. 2 in an intermediate position, according to various embodiments.

FIG. 6 is a front isometric view of the engagement mechanism 222 of the fixture 200 of FIG. 2 in an intermediate position, according to various embodiments. As shown, the handle 224 moves through the intermediate position when moving between the ready position shown in FIG. 2 and the engaged position shown in FIG. 3. The handle 224 rotates about the coaxial axes of the third pivot 232 and the sixth pivot and about the coaxial axes of the second pivot 230 and the fifth pivot, when the handle 224 is moving from the ready position to the engaged position. The first link 226 rotates about the axis of the first pivot 228, and the second link rotates about the axis of the fourth pivot, which is coaxial with the first pivot 228, as the handle 224 is moving from the ready position to the engaged position. The third pivot 232 and the sixth pivot move vertically with the push rod 234 as the handle 224 is moving from the ready position to the engaged position.

Figure 7:
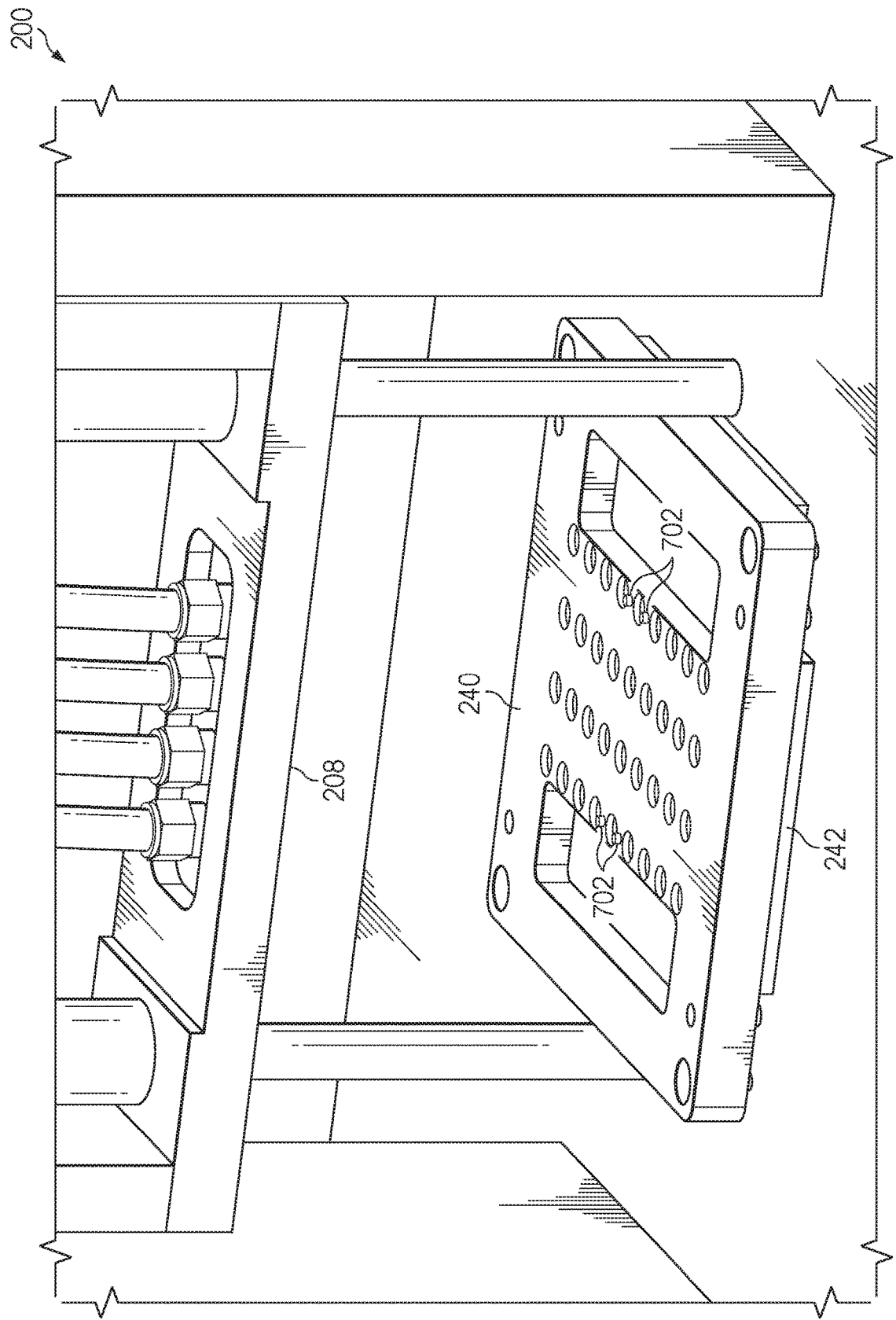
FIG. 7 is an isometric view of the device holder in the fixture of FIG. 2, according to various embodiments.

FIG. 7 is an isometric view of the device holder 240 in the fixture 200 of FIG. 2, according to various embodiments. As shown, the device holder 240 has at least two guide pins 702 that are used for ensuring a DUT 250 (not shown) that is placed in the test position on the device holder 240 is aligned with the connector holder 208. The guide pins 702 are configured such that the height that the guide pins 702 protrude above the device holder 240 is less than or equal to the thickness of the DUT 250, so that, when the fixture 200 is in the engaged position, the connector holder 208 does not contact the guide pins 702 without also contacting the DUT 250.

Figure 8:
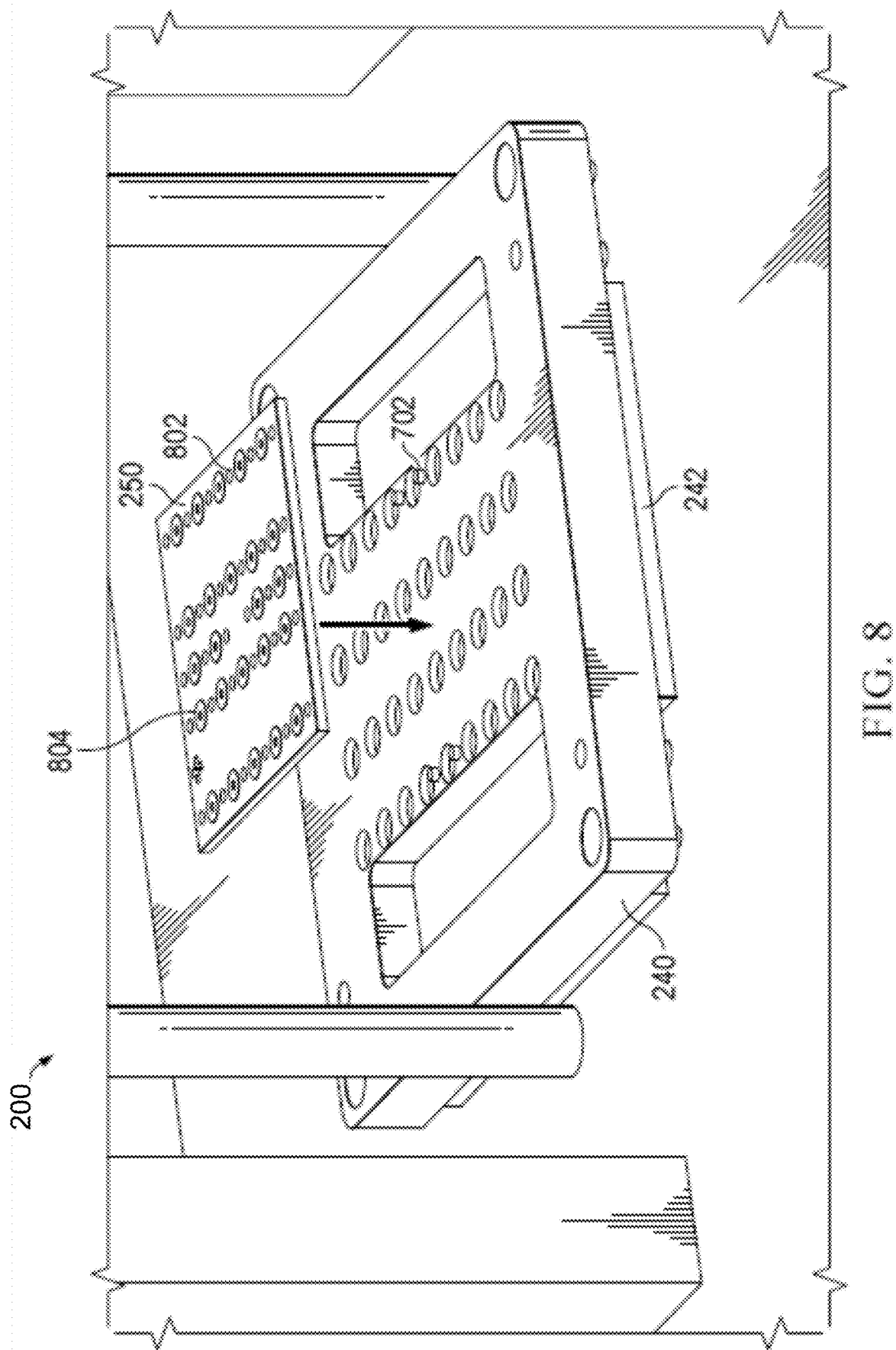
FIG. 8 is an isometric view of a DUT being installed on the device holder of FIG. 7, according to various embodiments.

FIG. 8 is an isometric view of a DUT 250 being installed on the device holder 240 of FIG. 7, according to various embodiments. As shown, at least two holes 802 in the DUT 250 are placed over the guide pins 702 in the device holder 240. The at least two guide pins 702 are used for ensuring that, when the DUT 250 is placed in the test position on the device holder 240, the DUT 250 is aligned with the connector holder so that contact points associated with each of the connectors held by the connector holder touch corresponding signal pads 804 on the DUT 250. This also ensures that the connectors held in the connector holder can contact the signal pads 804 of the DUT 250, when the fixture 200 is in the engaged position. Additionally or alternatively, the device holder 240 can have a cutout (not shown) configured to hold the DUT 250 in the test position and aligned with the connector holder.

Figure 9:
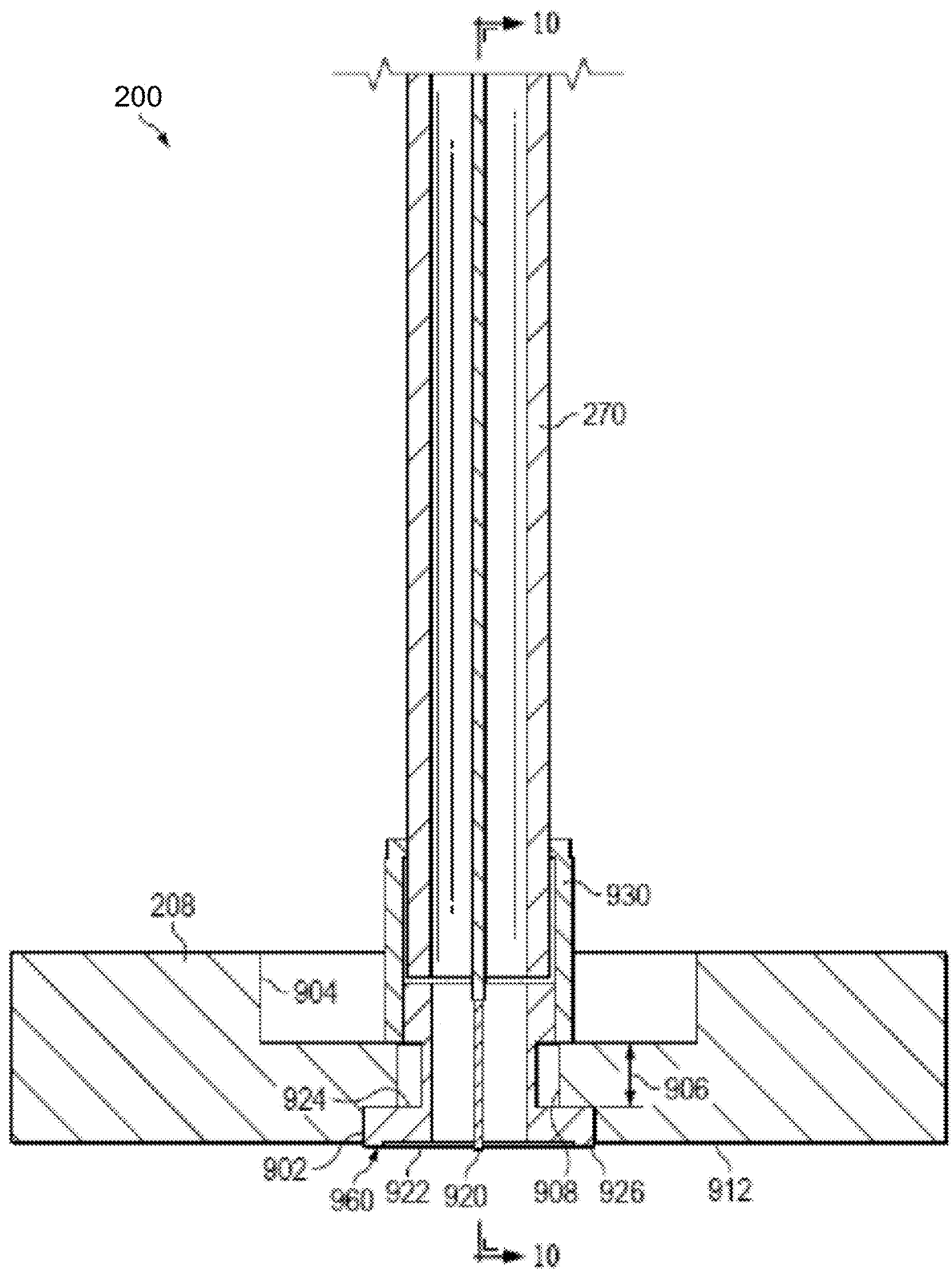
FIG. 9 is a side elevation cutaway view of the connector holder of the fixture of FIG. 2, according to various embodiments.

FIG. 9 is a side elevation cutaway view of the connector holder 208 of the fixture 200 of FIG. 2, according to various embodiments. As shown, the connector holder 208 has a cable connector cutout 902 and a hole 908 configured to hold a cable connector 960. Also shown are an end connector 930 of the cable 270, the cable connector 960, and a contact point 920 associated with the cable connector 960. When the fixture 200 is in the engaged position shown in FIG. 3, a signal pin and a ground ring 926 on each cable connector 960 held by the connector holder 208 are brought into contact with corresponding portions of the signal pad 804 (shown in FIG. 8) of the DUT 250. The cable connector cutout 902 has a depth sufficient to enable a base 924 of the cable connector 960 to be recessed within the connector holder 208, such that a bottom surface 922 of the cable connector 960 is aligned with or protrudes below a bottom surface 912 of the connector holder 208.

Also as shown, the connector holder 208 has an optional cable end cutout 904 to allow a hand (e.g., a hand of a test engineer) or a hand-tool to connect (e.g., thread on) the end connectors 930 of the cables 270 to the cable connectors 960. The cable end cutout 904 is optional because in some cases the connector holder 208 allows the end connectors 930 of the cables 270 to be connected to the cable connectors 960 without the presence of the cable end cutout 904.

The cable connectors 960 are removable from the connector holder 208, enabling the cable connectors to be easily replaced. For example, if a cable connector 960 is out of lifecycle, a test engineer can replace the out-of-lifecycle cable connector 960 with a new cable connector 960. In another example, if a test engineer wishes to perform testing over a different bandwidth, the test engineer can replace a set of cable connectors 960 of a first type (e.g., a 2.92 mm coaxial connector) with a new set of cable connectors 960 of a second type (e.g., a 1.85 mm coaxial connector).

The connector holder 208, cable end cutout 904, and cable connector cutout 902 are configured such that a thickness 906 of the connector holder 208 between the cable end cutout 904 and the cable connector cutout 902 can be clamped by the cable end 930 and the base 924 of the cable connector 960. The cable end 930 and the base 924 of the cable connector 960 can effectively clamp the thickness 906 of the connector holder 208 when the end connector 930 is threaded onto the cable connector 960. Clamping the thickness 906 of the connector holder 208 between the end connector 930 and the base 924 of the cable connector 960 can prevent the cable 270 and cable connector 960 from coming loose and detaching from the connector holder 208 when the fixture 200 is in the ready position, enabling the testing of each DUT 250 to proceed without the cables 270 and cable connectors 960 being straightened or otherwise repositioned.

Figure 10:
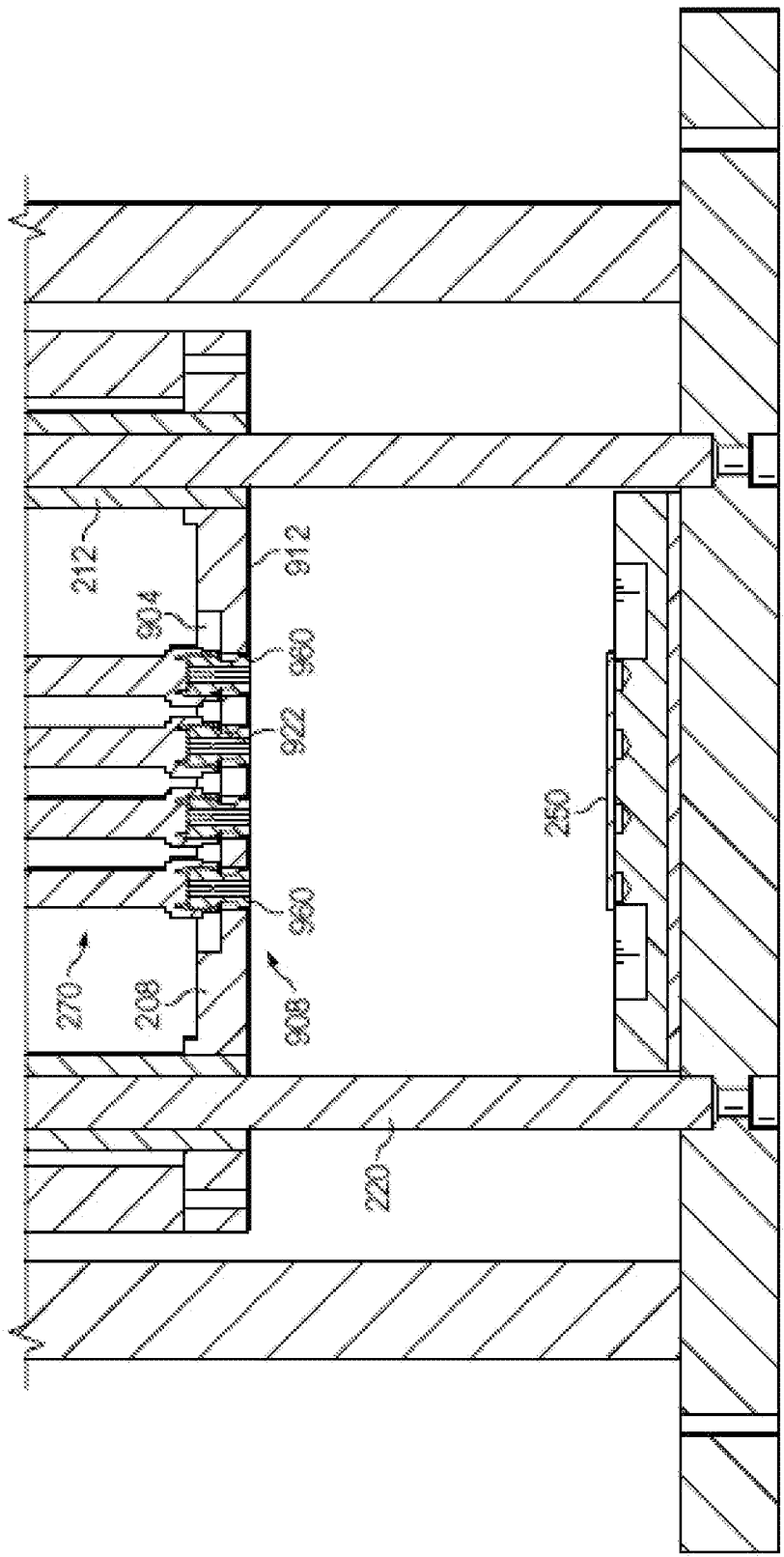
FIG. 10 is a front cutaway view of the connector holder of FIG. 9, according to various embodiments.

FIG. 10 is a front cutaway view of the connector holder 208 of FIG. 2, according to various embodiments. As shown, each of the holes 908 in the connector holder 208 holds a corresponding cable connector 960. As shown in greater detail in conjunction with FIG. 9, there is a cable connector cutout 902 aligned with each hole 908 to allow a base 924 of each connector 960 to be embedded in the connector holder 208 so that the bottom surfaces 922 of the cable connectors 960 protrude below or are aligned with a bottom surface 912 of the connector holder 208. Thus, when the fixture 200 is in the engaged position shown in FIG. 3, the contact points 920 associated with the cable connectors 960 contact corresponding signal pads 804 of the DUT 250 while the bottom surface 912 of the connector holder 208 is proximate to and/or contacts other portions of the DUT 250.

While connector holder 208 has four holes 908, if only two cable connectors 960 are held in connector holder 208, then the connector holder 208 may be used to perform a test using two cables instead of four (e.g., a single-ended test). Also, while connector holder 208 has four holes 908 and connector holder 508 has two holes, other connector holders having other numbers of holes may be used with the fixture 200.

Figure 11:
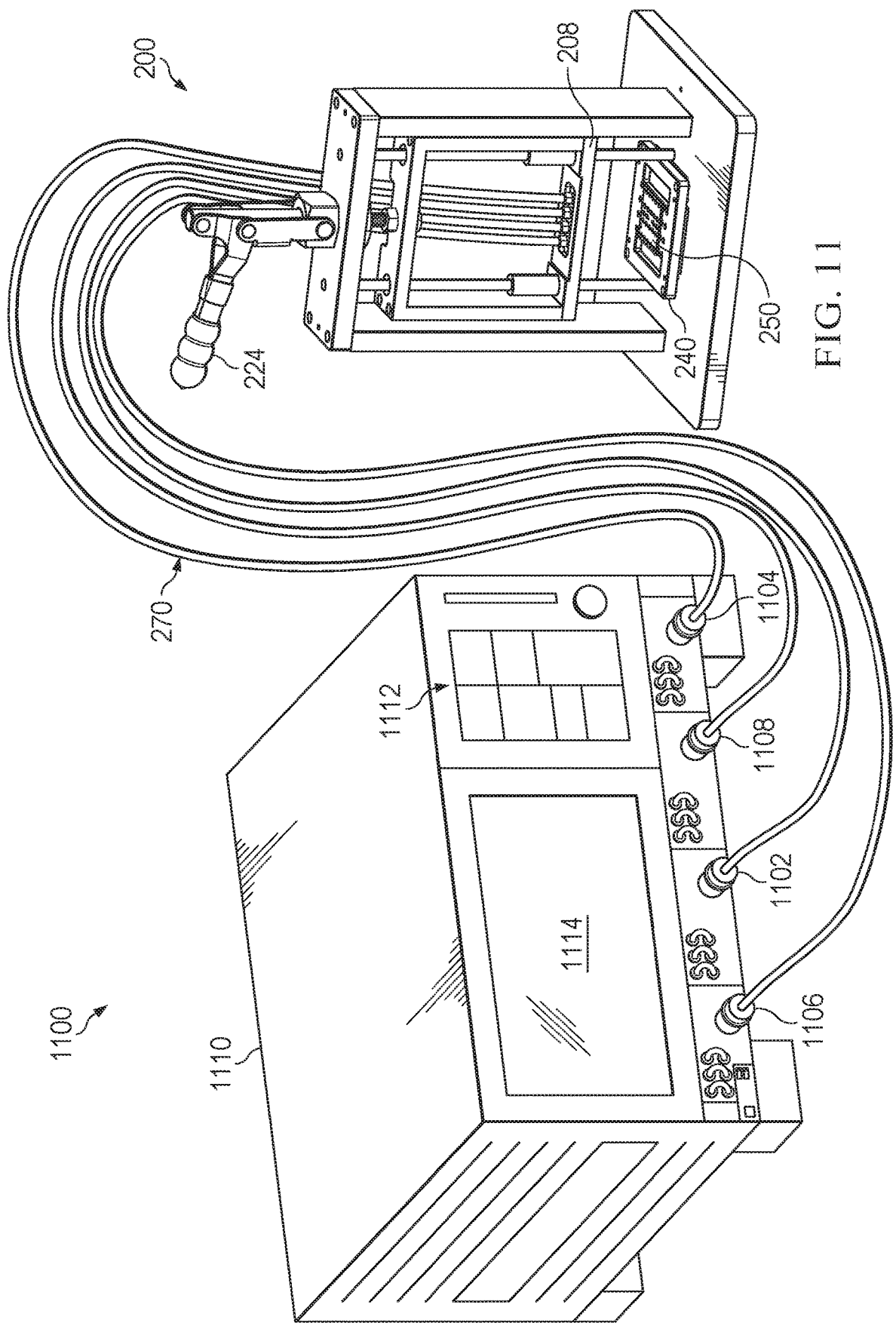
FIG. 11 is an isometric view of a system that is configured to implement one or more aspects of the various embodiments.

FIG. 11 is an isometric view of a system 1100 that is configured to implement one or more aspects of the various embodiments. As shown, cables 270 connected to the cable connectors in the connector holder 208 can be connected, at their other ends 1102, 1104, 1106, and 1108, with a network analyzer 1110. Thus, when the fixture 200 is in the engaged position shown in FIG. 3, the DUT 250 is in electric communication with the network analyzer 1110, and a test engineer can see the test results for the DUT 250 on the display 1114 of the network analyzer 1110. The test engineer can control the tests run by the network analyzer 1110 by means of controls on a control panel 1112 of the network analyzer 1110. When the test engineer is satisfied with the test results of the DUT 250, the test engineer moves the handle 224 of the fixture 200 to the ready position, as shown, removes the DUT 250, places a new DUT 250 on the device holder 240, moves the handle 224 of the fixture 200 to the engaged position shown in FIG. 3, and is able to use the network analyzer 1110 to test the new DUT 250.

In sum, embodiments of the present disclosure set forth a fixture for holding a device under test (DUT) during testing. The fixture includes a connector holder with holes each configured to hold a cable connector, a device holder configured to hold the device in a testing position, and a push rod configured to support the connector holder and operable to move the connector holder. When the push rod moves the connector holder into an engaged position in the fixture, contact points of connectors, in the connector holder, move into contact with signal pads of the device. The fixture enables the rapid testing of a device by simultaneously moving contact points of cable connectors into contact with signal pads of the device. Moving the push rod and connector holder into the engaged position with a locking mechanism applies a consistent force from the contact points associated with the cable connectors onto the test pads associated with each device that is tested in turn, thereby enabling consistent, reproducible testing of each of the devices.

At least one technical advantage of the disclosed design relative to the prior art is that, with the disclosed design, devices can be tested far more rapidly than what is possible with prior art designs and techniques. Another technical advantage is that the disclosed design enables more robust and consistent testing device-to-device than what is possible using prior art designs and techniques. Another technical advantage is that the disclosed design reduces wear on the cable connectors as compared to the prior art designs and techniques, lowering the expense of testing. These technical advantages provide one or more technological improvements over prior art approaches.

1. In various embodiments, a system for testing multiple devices comprises a connector holder having a plurality of holes, wherein each hole included in the plurality of holes is configured to hold a respective cable connector that connects to a cable; a device holder that is configured to hold a first device in a testing position; and an engagement mechanism that supports the connector holder and is operable to move the connector holder to an engaged position, wherein, when the first device is being held by the device holder in the testing position, and a first hole included in the plurality of holes holds a first cable connector, a contact point associated with the first cable connector contacts a signal pad associated with the first device.

2. The system of clause 1, wherein the connector holder includes a first cable connector cutout that is aligned with the first hole such that, when the first hole holds the first cable connector, the contact point associated with the first cable connector is aligned with a bottom surface of the connector holder.

3. The system of any of clauses 1-2, wherein the connector holder has a cable end cutout.

4. The system of any of clauses 1-3, wherein the connector holder has a thickness between a top surface of a cable connector cutout and a surface of the connector holder that is opposite the top surface of the cable connector cutout; and the connector holder is configured such that the first cable connector and a cable end, of a cable connected with the first cable connector, clamp the thickness.

5. The system of any of clauses 1-4, wherein the device holder comprises at least two guide pins configured to fit into respective guide holes associated with the first device.

6. The system of any of clause 5, wherein each guide pin included in the at least two guide pins has a height that is less than or equal to the sum of a height of the device holder and a thickness of the first device.

7. The system of any of clauses 1-6, further comprising a screw that adjusts an amount of force applied by the connector holder to the first device when the engagement mechanism is operated to move the connector holder.

8. The system of any of clauses 1-7, further comprising a base beneath the device holder; and a cushion that compresses between the device holder and the base when the engagement mechanism is operated to move the connector holder to the engaged position.

9. The system of clause 8, wherein the cushion comprises rubber.

10. The system of any of clauses 1-9, further comprising a connector holder frame, wherein the connector holder is removably connected to the connector holder frame and the connector holder frame is connected with the engagement mechanism.

11. In various embodiments, a system for testing multiple devices comprises a first cable; a first cable connector connected to the first cable; a connector holder having a plurality of holes, wherein a first hole included in the plurality of holes holds the first cable connector; a device holder that is configured to hold a first device in a testing position; and an engagement mechanism that supports the connector holder and is operable to move the connector holder to an engaged position, wherein when the first device is being held by the device holder in the testing position, a first contact point associated with the first cable connector contacts a first signal pad associated with the first device.

12. The system of clause 11, wherein the connector holder includes a first cable connector cutout that is aligned with the first hole such that the first contact point associated with the first cable connector is aligned with a bottom surface of the connector holder.

13. The system of any of clauses 11-12, wherein the connector holder has a cable end cutout.

14. The system of any of clauses 11-13, wherein the connector holder is clamped between the first cable connector and a cable end of the first cable.

15. The system of any of clauses 11-14, wherein the device holder comprises at least two guide pins configured to fit into respective guide holes associated with the first device.

16. The system of clause 15, wherein each guide pin included in the at least two guide pins has a height that is less than or equal to the sum of a height of the device holder and a thickness of the first device.

17. The system of any of clauses 11-16, further comprising a screw that adjusts an amount of force applied by the connector holder to the first device when the engagement mechanism is operated to move the connector holder.

18. The system of any of clauses 11-17, further comprising a support frame that supports the engagement mechanism; a base that supports the support frame; a guiderail rigidly connected with the support frame and the base; and a guide rigidly connected with the connector holder and operable to slide along the guiderail.

19. The system of any of clauses 11-18, further comprising one or more second cables; one or more second cable connectors, wherein: each of the second cable connectors is connected to a different second cable; one or more second holes included in the plurality of holes holds a respective second cable connector; and when the first device is being held by the device holder in the testing position, second contact points associated with the one or more second cable connectors contact second signal pads associated with the first device.

20. The system of clause 19, further comprising a network analyzer, wherein the first cable and the one or more second cables are connected with the network analyzer.

Any and all combinations of any of the claim elements recited in any of the claims and/or any elements described in this application, in any fashion, fall within the contemplated scope of the present invention and protection.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, an apparatus, or a method. Accordingly, aspects of the present disclosure may take the form of an entirely hardware embodiment or a partial hardware embodiment.

While the preceding is directed to embodiments of the present disclosure, other and further embodiments of the disclosure may be devised without departing from the basic scope thereof, and the scope thereof is determined by the claims that follow.

What is claimed is:

1. A system for testing multiple devices, comprising:
   a connector holder having a plurality of holes, wherein each hole included in the plurality of holes is configured to hold a respective cable connector that connects to a cable;
   a device holder that is configured to hold a first device in a testing position and comprises at least two guide pins configured to fit into respective guide holes associated with the first device; and
   an engagement mechanism that supports the connector holder and is operable to move the connector holder to an engaged position, wherein, when the first device is being held by the device holder in the testing position, and a first hole included in the plurality of holes holds a first cable connector, a contact point associated with the first cable connector contacts a signal pad associated with the first device.

2. The system of claim 1, wherein the connector holder includes a first cable connector cutout that is aligned with the first hole such that, when the first hole holds the first cable connector, the contact point associated with the first cable connector is aligned with a bottom surface of the connector holder.

3. The system of claim 1, wherein the connector holder has a cable end cutout.

4. The system of claim 1, wherein:
   the connector holder has a thickness between a top surface of a cable connector cutout and a surface of the connector holder that is opposite the top surface of the cable connector cutout; and
   the connector holder is configured such that the first cable connector and a cable end, of a cable connected with the first cable connector, clamp the thickness.

5. The system of claim 1, wherein each guide pin included in the at least two guide pins has a height that is less than or equal to the sum of a height of the device holder and a thickness of the first device.

6. The system of claim 1, further comprising a screw that adjusts an amount of force applied by the connector holder to the first device when the engagement mechanism is operated to move the connector holder.

7. The system of claim 1, further comprising:
   a base beneath the device holder; and
   a cushion that compresses between the device holder and the base when the engagement mechanism is operated to move the connector holder to the engaged position.

8. The system of claim 7, wherein the cushion comprises rubber.

9. The system of claim 1, further comprising a connector holder frame, wherein the connector holder is removably connected to the connector holder frame and the connector holder frame is connected with the engagement mechanism.

10. A system for testing multiple devices, comprising:
    a first cable;
    a first cable connector connected to the first cable;
    a connector holder having a plurality of holes, wherein a first hole included in the plurality of holes holds the first cable connector;
    a device holder that is configured to hold a first device in a testing position and comprises at least two guide pins configured to fit into respective guide holes associated with the first device; and
    an engagement mechanism that supports the connector holder and is operable to move the connector holder to an engaged position, wherein when the first device is being held by the device holder in the testing position, a first contact point associated with the first cable connector contacts a first signal pad associated with the first device.

11. The system of claim 10, wherein the connector holder includes a first cable connector cutout that is aligned with the first hole such that the first contact point associated with the first cable connector is aligned with a bottom surface of the connector holder.

12. The system of claim 10, wherein the connector holder has a cable end cutout.

13. The system of claim 10, wherein the connector holder is clamped between the first cable connector and a cable end of the first cable.

14. The system of claim 10, wherein each guide pin included in the at least two guide pins has a height that is less than or equal to the sum of a height of the device holder and a thickness of the first device.

15. The system of claim 10, further comprising a screw that adjusts an amount of force applied by the connector holder to the first device when the engagement mechanism is operated to move the connector holder.

16. The system of claim 10, further comprising:
a support frame that supports the engagement mechanism;
a base that supports the support frame;
a guiderail rigidly connected with the support frame and the base; and
a guide rigidly connected with the connector holder and operable to slide along the guiderail.

17. The system of claim 10, further comprising:
one or more second cables;
one or more second cable connectors, wherein:
   each second cable connector included in the one or more second cable connectors is connected to a different second cable;
   one or more second holes included in the plurality of holes holds a respective second cable connector; and
   when the first device is being held by the device holder in the testing position, second contact points associated with the one or more second cable connectors contact second signal pads associated with the first device.

18. The system of claim 17, further comprising a network analyzer, wherein the first cable and the one or more second cables are connected with the network analyzer.

\* \* \* \* \*